(12) United States Patent
Prajuckamol et al.

(10) Patent No.: US 10,056,317 B1
(45) Date of Patent: Aug. 21, 2018

(54) SEMICONDUCTOR PACKAGE WITH GROUNDING DEVICE AND RELATED METHODS

(71) Applicant: SEMICONDUCTOR COMPONENTS INDUSTRIES, LLC, Phoenix, AZ (US)

(72) Inventors: Atapol Prajuckamol, Klaeng (TH); Sw Wang, Seremban (MY); Kai Chat Tan, Tangkak (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/789,120

(22) Filed: Oct. 20, 2017

(51) Int. Cl.
*H01L 23/495* (2006.01)
*H01L 23/00* (2006.01)
*H01L 23/498* (2006.01)

(52) U.S. Cl.
CPC ...... *H01L 23/4951* (2013.01); *H01L 23/4952* (2013.01); *H01L 23/49861* (2013.01); *H01L 24/03* (2013.01)

(58) Field of Classification Search
CPC ............ H01L 23/4951; H01L 23/4952; H01L 23/49861; H01L 24/03
USPC ........................................................ 257/676
See application file for complete search history.

(56) References Cited

U.S. PATENT DOCUMENTS

| | | | |
|---|---|---|---|
| 6,873,032 B1 | 3/2005 | McCann | |
| 7,541,221 B2 * | 6/2009 | Bathan | H01L 23/49548 257/666 |
| 8,642,395 B2 | 2/2014 | Li | |
| 9,231,119 B2 * | 1/2016 | Yoshiuchi | G01C 19/5783 |
| 2016/0104662 A1 | 4/2016 | Prajuckamol et al. | |

* cited by examiner

*Primary Examiner* — Tu-Tu Ho
(74) *Attorney, Agent, or Firm* — IPTechLaw

(57) ABSTRACT

Implementations of a semiconductor package may include a first side of a die coupled to a first side of an electrically insulative layer, a second side of the electrically insulative layer coupled to a lead frame, and at least one ground stud physically coupled to the lead frame and to the die, the at least one ground stud extending from the second side of the electrically insulative layer into the electrically insulative layer from the lead frame. The die may be wire bonded to the lead frame.

20 Claims, 5 Drawing Sheets

SEMICONDUCTOR PACKAGE WITH GROUNDING DEVICE AND RELATED METHODS

BACKGROUND

1. Technical Field

Aspects of this document relate generally to semiconductor packages, such as chip on lead packages. More specific implementations involve semiconductor packages with a backside ground down.

2. Background

Conventionally, a chip on lead (COL) semiconductor package decreased semiconductor size as it eliminates the need for a die attach pad and placed the die on extended lead fingers. This allowed for a smaller package to house the same die, or for a larger die to fit into the previous package used with a die attach pad. In a conventional COL package, an electrically non-conductive layer separates the die from the lead frame to isolate electrical communication to the wire bonds between the die and the lead frame.

SUMMARY

Implementations of a semiconductor package may include a first side of a die coupled to a first side of an electrically insulative layer, a second side of the electrically insulative layer coupled to a lead frame, and at least one ground stud physically coupled to the lead frame and to the die, the at least one ground stud extending from the second side of the electrically insulative layer into the electrically insulative layer from the lead frame. The die may be wire bonded to the lead frame.

Implementations of the semiconductor package may include one, all, or any of the following:

The package may include an electrically conductive layer coupled between the electrically insulative layer and the die.

The at least one ground stud may include two ground studs physically coupled to the lead frame and the die.

The at least one ground stud may extend completely through the electrically insulative layer.

The lead frame may include a die flag coupled to the second side of the electrically insulative layer.

The at least one ground stud may physically contact the die flag and may be physically coupled to the die.

The semiconductor package may be a chip on lead package.

Implementations of a semiconductor package may include a first side of a die directly coupled to a first side of an electrically conductive layer, a first side of an electrically non-conductive layer directly coupled to a second side of the electrically conductive layer opposing the first side of the electrically conductive layer, a lead frame directly coupled to a second side of the electrically non-conductive layer opposing a first side of the electrically non-conductive layer, and at least one ground stud coupled to the lead frame. The ground stud may extend through the electrically non-conductive layer and into the electrically conductive layer physically coupling the lead frame and the second side of the electrically conductive layer together. A second side of the die may be wire bonded to the lead frame.

Implementations of the semiconductor package may include one, all, or any of the following:

The at least one ground stud may include two ground studs physically coupled to the lead frame and the die.

The electrically conductive layer may be a first wafer backside coating.

The electrically non-conductive layer may be a second wafer backside coating.

The at least one ground stud may be 35-40 micrometers thick.

The lead frame may include a die flag coupled to the second side of the electrically non-conductive layer.

The at least one ground stud may physically contact the die flag and may be physically coupled to the die.

Implementations of a method for forming a semiconductor package may include coating a wafer with a first wafer backside coating (WBC), forming a second WBC over the first WBC, and singulating the wafer into a plurality of die. The method may include forming at least one ground stud on a lead frame, pressing the at least one ground stud through a material of the second WBC to contact the at least one ground stud with the first WBC, and wire bonding the die to the lead frame.

Implementations of the semiconductor package may include one, all, or any of the following:

The first WBC may be electrically conductive.

The second WBC may be electrically non-conductive.

The at least one ground stud may include two ground studs physically coupled to the lead frame and the die.

The at least one ground stud may be gold.

The at least one ground stud may be copper.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
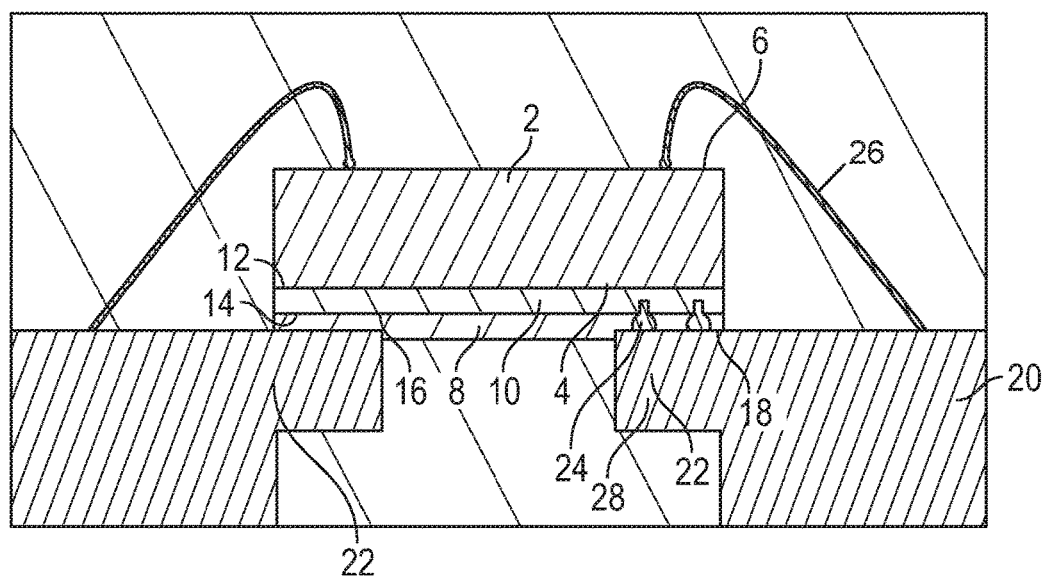
FIG. 1 is a cross sectional side view of a chip on lead package with a backside ground.

Referring to FIG. 1, a cross sectional side view of a chip on lead package with a backside ground is illustrated. The semiconductor package includes a die 2. The die includes a first side 4, or a backside, and an opposing second side 6. The die 2 is coupled to an electrically insulative, or electrically non-conductive, layer 8. In various implementations, the die 2 may be directly coupled to the electrically insulative layer 8. In other implementations, an electrically conductive layer 10 is coupled between and separates the die 2 from the electrically insulative layer 8. In such implementations, the first side 4 of the die may be directly coupled to a first side 12 of the electrically conductive layer 10. A second side 14 of the electrically conductive layer 10 may be directly coupled a first side 16 of the electrically insulative layer 8. The electrically conductive layer 10 may be a first wafer backside coating (WBC). The electrically insulative layer 8 may be a second WBC. In various implementations, the electrically conductive layer 10 is substantially 18 micrometers thick, while in other implementations the electrically conductive layer 10 may be more or less than 18 micrometers thick. In various implementations, the electrically insulative layer 8 is substantially 25 micrometers thick, while in other implementations the electrically insulative layer 8 may be more or less than 25 micrometers thick.

A second side 18 of the electrically insulative layer 8 may be coupled to a lead frame 20. In various implementations, the second side 18 of the electrically insulative layer 8 may be directly coupled to a plurality of leads 22, as illustrated in cross sectional view of FIG. 1. In the implementation illustrated by FIG. 1, the lead frame 20 does not include a die flag. In various implementations of semiconductor packages, such as the one illustrated by FIG. 1, no die flag is necessary as the die is supported by and physically coupled to the leads 22. Such implementations may reduce the overall footprint of the semiconductor package.

The semiconductor package includes at least one ground stud 24. The ground stud 24 may be a wire bond stud in various implementations. In a particular implementation, the package includes two ground studs, as illustrated in FIG. 1. In other implementations, the package may include more than two ground studs. The ground studs may be, by non-limiting example, gold, copper, or any other conductive material. The material of the ground stud 24 has a durometer which is harder than the durometer of the electrically insulative layer 8. In implementations with an electrically conductive layer 10, the ground stud 24 may also have a durometer which is harder than the durometer of the electrically conductive layer 10. In implementations without the electrically conductive layer, the ground stud 24 may have a durometer harder than the durometer of the die 2 or a durometers of another layer of material on the backside of the die. In various implementations, the durometer of the ground stud 24 may the same as or less than the durometer of the lead frame 20. In various implementations, the at least one ground stud 24 may be between 35-40 micrometers high. In other implementations, the height of the ground studs may be less than 35 micrometers or more than 40 micrometers. As illustrated, the at least one ground stud 24 is physically coupled to the lead frame 20 and to the die 2 and may physically contact the lead frame 20. The ground stud 24 may be directly coupled to a ground lead 28 of the plurality of leads 22. As illustrated, the one or more ground studs 24 extend from the lead frame, or second side 18 of the insulative layer 8, and completely through the insulative layer 8. In implementations with a conductive layer 10, the one or more ground studs 24 extend at least to the electrically conductive layer 10, and may extend into the electrically conductive layer 10 or even through the conductive layer 10. In this manner, the at least one ground stud 24 physically couples the lead frame and the second side 14 of the electrically conductive layer 10 together. In implementations without an electrically conductive layer 10, the one or more ground studs 24 extend at least to the die 2, and may extend into the die 2. Where the ground stud 24 physically contacts the electrically conductive layer 10, the ground stud 24 also electrically couples the leadframe with the electrically conductive layer.

The semiconductor package includes a plurality of electrical connectors 26 which electrically couple the die 2 to the plurality of leads 22. In various implementations, and as illustrated by FIG. 1, the electrical connectors may be wires that are wire bonded to the second side 6 of the die and to the lead frame 20. The die may also be wire bonded to the plurality of leads 22. In other implementations, the die 2 may be electrically coupled to the plurality of leads through, by non-limiting example, a clip, a through-silicon-via (TSV), a ball, a bump, or studs different from the ground studs. In various implementations, a mold compound may encapsulate the entirety of or a portion of the die, the leads, and the wire bonds (or other electrical couplers disclosed herein). The mold compound may be, by non-limiting example, an epoxy mold compound, an acrylic molding compound, or another type of material capable of providing protection against ingress of contaminants and moisture into the package.

Figure 2:
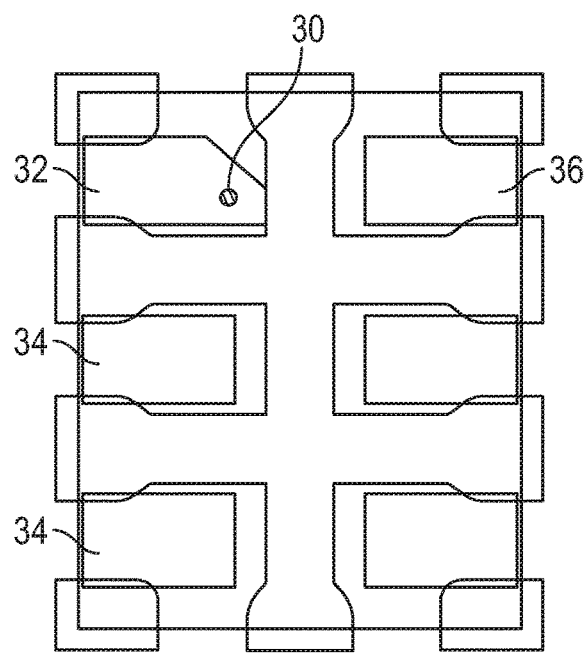
FIG. 2 is top view of a lead frame with a single ground stud thereon.

Referring to FIG. 2, a top view of a lead frame with a single ground stud thereon is illustrated. As previously discussed herein, a single ground stud 30 may be coupled to a ground lead 32 of a plurality of leads 34 of a lead frame 36. In other implementations, more than a single ground stud may be coupled to the lead frame. For example, referring to FIG. 3, a top view of a lead frame with two ground studs thereon is illustrated.

Figure 3:
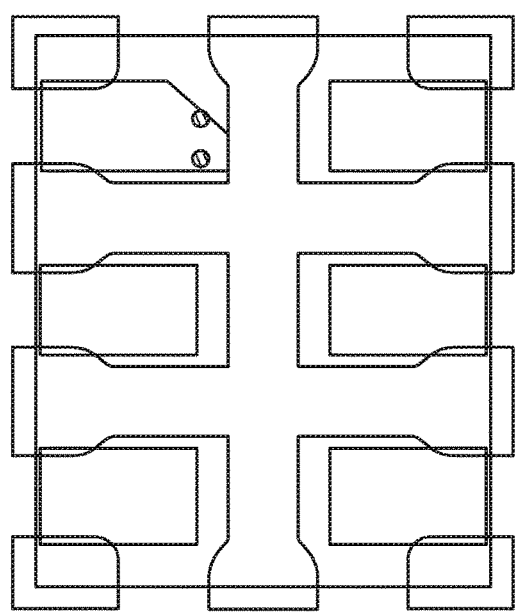
FIG. 3 is a top view of a lead frame with two ground studs thereon.
Figure 4:
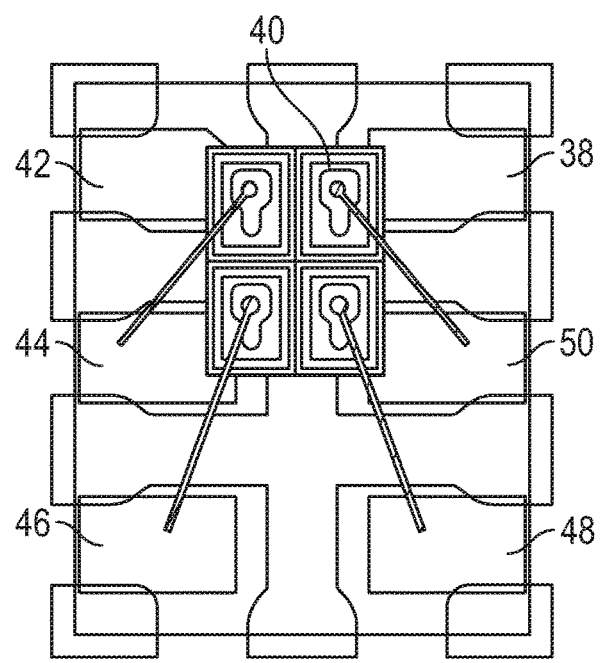
FIG. 4 is a top view of a chip on lead package.
Figure 5:
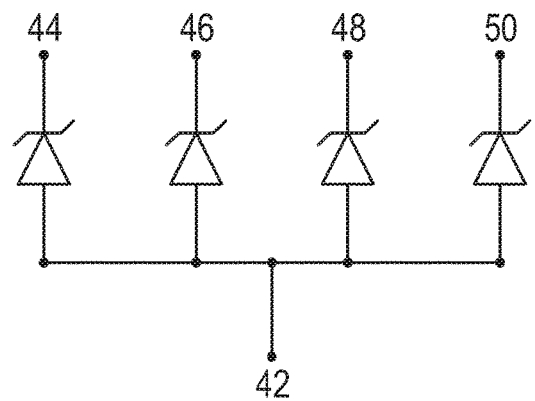
FIG. 5 is a potential implementation of a circuit diagram for the semiconductor package illustrated in FIG. 4.

Referring to FIG. 4, a top view of a chip on lead package is illustrated. As illustrated in FIG. 4, the package includes a lead frame 38 similar to the lead frames of FIG. 2 and FIG. 3. A chip 40 is coupled to the lead frame 38. Specifically, the chip is directly supported by four different leads. The package includes a ground lead 42. One or more ground studs as illustrated in FIG. 2 or FIG. 3 physically couple the ground lead 42 to the chip 40. The chip may be wire bonded, or electrically coupled using other electrical couplers disclosed herein, to a plurality of other leads within the lead frame. Specifically, as illustrated in FIG. 4, the chip 40 may be wire bonded to a first lead 44, to a second lead 46, to a third lead 48, and to a fourth lead 50. In other implementations, the chip may be bonded to more or fewer leads than this. As disclosed herein, where the ground stud contacts the chip or an electrically conductive layer of the chip, the ground lead also electrically couples the chip 40 with the ground lead 42. Referring to FIG. 5, a possible circuit diagram for the semiconductor package illustrated in FIG. 4 is illustrated.

The semiconductor package illustrated by FIG. 1 and FIG. 4 is a chip on lead package. The footprint of the package is reduced as the die is able to sit directly on the leads and the ground connection is formed through a ground stud between a lead and the die. In other implementations, unlike the implementation of FIG. 1, the semiconductor package may include a die flag. Implementations of semiconductor packages utilizing die flags and methods related thereto that may be used with ground studs like those disclosed herein may be the same as or similar to the packages and methods disclosed in U.S. Patent Application Publication. No. 20160104662 to Prajuckamol et al. entitled "Method and System for Extending Die Size and Packaged Semiconductor Devices Incorporating the Same," published on Apr. 14, 2016, the disclosure of which is hereby incorporated entirely herein by reference.

Figure 6:
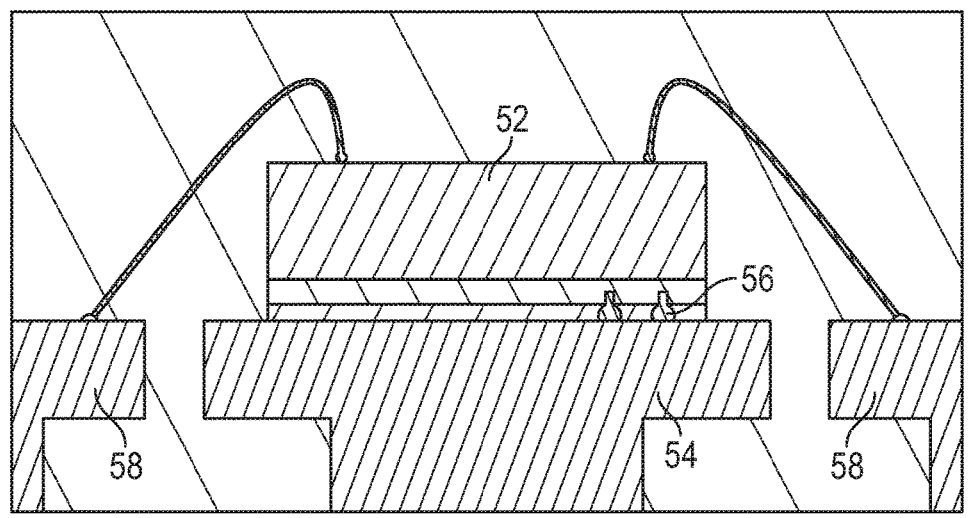
FIG. 6 is a cross sectional side view of a semiconductor package with a backside ground.

Referring to FIG. 6, a cross sectional side view of a semiconductor package with two backside ground studs coupled to a die flag is illustrated. The package of FIG. 6 may be similar to the package of FIG. 1, with the difference being that the die 52 is coupled to and supported by a die flag 54 rather than by a plurality of leads. Likewise, the package includes at least one ground stud 56 which electrically couples the die flag 54 to the die 52 rather than a lead to the die. The die 52 may still be wire bonded to a plurality of leads 58. However, as illustrated in FIG. 6, this package has a larger footprint that the package of FIG. 1, due to the presence of the die flag itself.

In various implementations similar to the implementation disclosed in FIG. 6, the semiconductor package may include an insulative layer which serves as a spacer between the die and the leads of the lead frame. In particular implementations, a cross section of the insulative layer is rectangular, while in other implementations, the cross section of the insulative layer may be a T-shaped layer, with a top portion of the electrically insulative layer wider than a bottom portion of the electrically insulative layer. The ends of the top portion of the electrically insulative layer may extend over the leads of the lead frame, leaving a gap between the leads and the insulative layer directly over the leads. In other implementations, no gap or a very minimal gap between the leads and the spacer is formed if the spacer is not a T-shape. The semiconductor package may include one or more die coupled over the insulative layer. Because of the increased width of the top portion of the insulative layer, the semiconductor package may be able to accommodate and support larger die without expanding the footprint of the semiconductor package. In such implementations, the semiconductor package still includes one or more ground studs coupled directly to the die flag which extend up and through the insulative layer and electrically couple to the die. In such implementations, the T-shaped insulative layer which acts as a spacer provides support for a larger die to be used with a smaller lead frame. To further decrease the size of the semiconductor package, the ground stud enables the die flag to serve as the ground rather than having to provide an additional ground or ground lead within the semiconductor package.

An implementation of a method of forming a semiconductor package with a backside ground may include coating a wafer with a first WBC. The first WBC may be conductive. The first WBC may be substantially 18 micrometers thick, however, in other implementations the first WBC is more or less thick than 18 micrometers. The method may include forming a second WBC over the first WBC. The second WBC may be electrically insulative. The second WBC may be substantially 25 micrometers thick, however, in other implementations the second WBC is more or less thick than 25 micrometers. In other implementations, the method includes forming only a single electrically insulative WBC to the die and not including an electrically conductive WBC. The wafer coupled to the first and second WBC is then singulated into a plurality of die. Singulation may occur using, by non-limiting example, a saw, a laser, a waterjet, plasma etching, deep reactive-ion etching, or chemical etching.

Figure 7A:
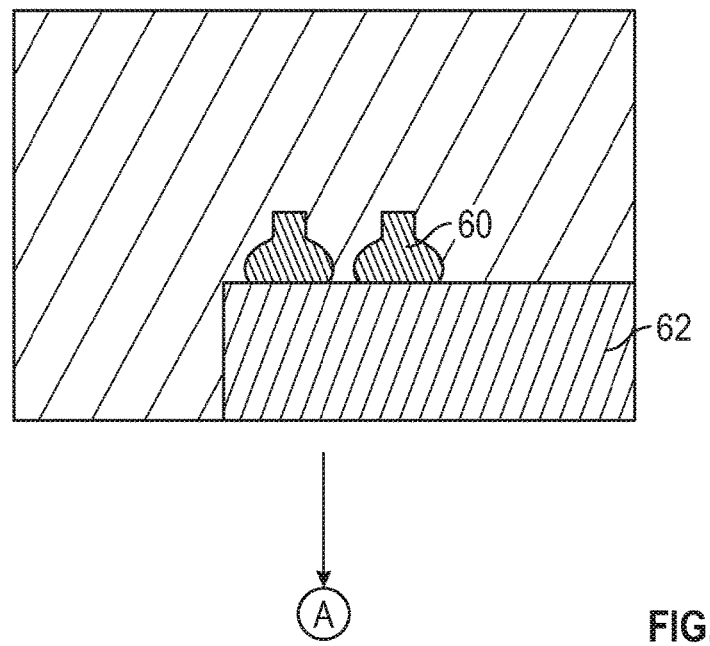
FIGS. 7A-7D are cross sectional side views illustrating the formation of a chip on lead package with a backside ground.

Referring to FIGS. 7A-7D, cross sectional side views illustrating the formation of a chip on lead package with a backside ground stud is illustrated. Referring specifically to FIG. 7A, the method includes forming at least one ground stud 60 on a lead frame 62. In particular implementations, the method includes forming two ground studs on the lead frame. The ground studs may be formed on a lead, as illustrated by FIG. 1, or on a die flag, as illustrated by FIG. 6, of the lead frame. The ground studs may be any type of ground stud disclosed herein and may include any dimensions disclosed herein. The ground studs may be formed in various implementations using, by non-limiting example, a wirebonding process, a plating process, a metal deposition process, and any other method of forming metal on another metal surface.

Figure 7B:
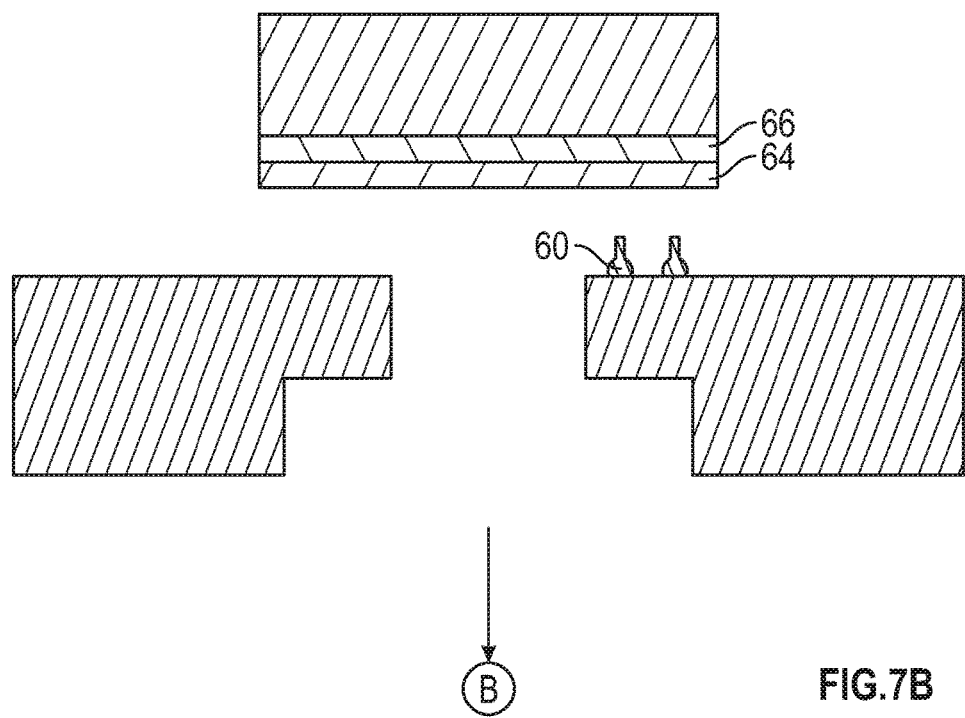
Figure 7C:
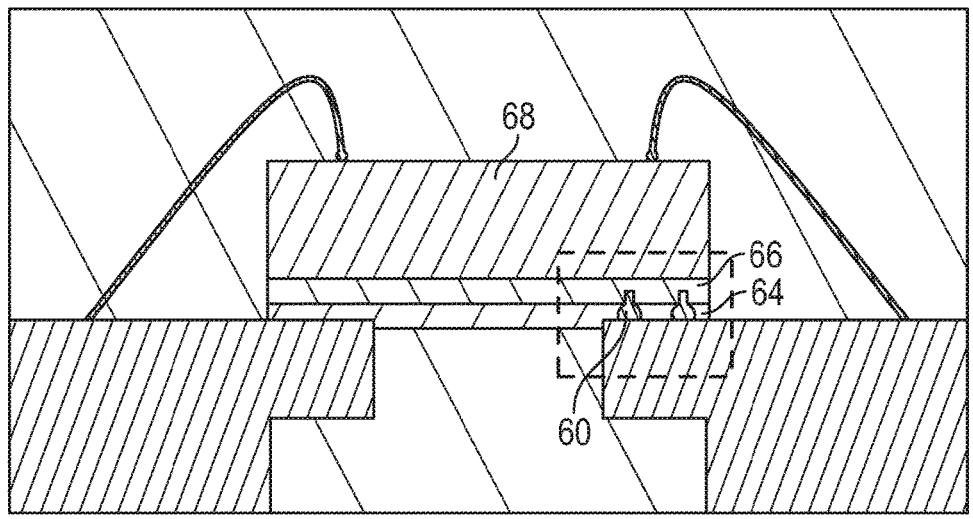
Figure 7D:
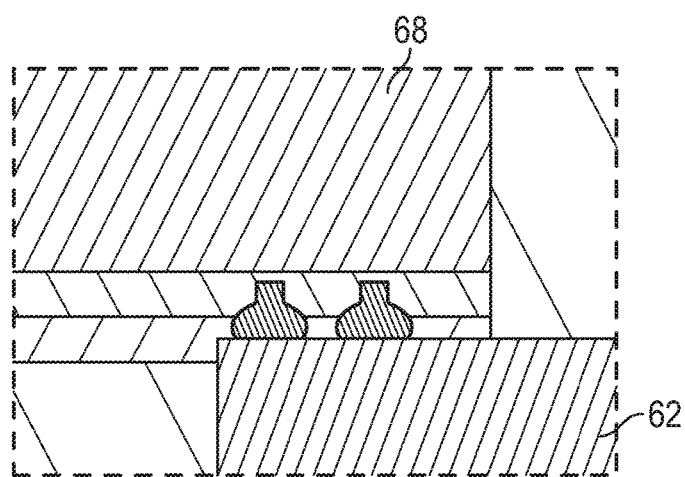

Referring to FIGS. 7B and 7C, the method for forming the semiconductor package includes pressing the at least one ground stud 60 through the material of the second WBC 64 to contact the ground stud 60 with the first WBC 66. Referring to FIG. 7D, a magnified view of the at least one ground stud physically coupled to the lead frame 62 and the die 68 is illustrated. As can be seen from FIG. 7D, the at least one ground stud may be pressed into the first WBC 66. In other implementations, the at least one ground stud is only pressed through to the first WBC so the conductive WBC is contacting the ground stud but the ground stud is not within the first WBC. In implementations with only a single insulative layer, or WBC, the method may include pressing the ground stud through the insulative WBC and to, or into, the die 68. In various implementations, pressing the one or more ground studs 60 through the insulative layer 64 includes pressing the ground stud through the insulative layer until the insulative layer 64 directly contacts the leads. In still other implementations, pressing the one or more ground studs 60 through the insulative layer 64 includes pressing the ground stud through the insulative layer until the insulative layer 64 extends below a top surface of the leads, as is illustrated in FIG. 7C. The operation of pressing the ground stud may be done using the chip placing tool in various implementations, or through a subsequent die pressing operation after the die is placed on the leadframe.

Referring back to FIG. 7C, the method also includes electrically coupling the die 68 to the lead frame 62. In a particular implementation, the method may include wire bonding the die 68 to the lead frame 62. In other implementations, the method may include electrically coupling the die 68 with the leads 62 through using other electrical couplers, such as, by non-limiting example, clips, other studs aside from the ground studs, or TSVs. Part of electrically coupling the die 68 to the leadframe 62 may occur during the pressing of the ground stud 60 through the WBC layer(s).

In various implementations, the method may also include covering entirely or partially the die, the wires or other electrical couplers, and/or the leads with a mold compound. The mold compound may be applied using, by non-limiting example, a liquid dispensing technique, a transfer molding technique, a printer molding technique, a film molding technique, a compression molding technique and any other technique for creating solidified mold compound around the die, leads and wires or other electrical couplers.

In implementations of forming a semiconductor package where the insulative layer acts as a T-shaped spacer, the method includes, prior to pressing ground studs directly coupled to a die flag through an insulative layer, forming the T-shaped insulative layer. In implementations where the insulative layer is formed by a second WBC over the conductive layer, the second WBC may be etched and/or formed to form the T-shaped spacer. In other implementations, the insulative T-shaped layer is formed over the conductive layer and die using methods different from applying a WBC, either through, by non-limiting example, spray coating, dry film application, deposition, or other techniques for applying a material to a desired area.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a first side of a die coupled to a first side of an electrically insulative layer;
   a second side of the electrically insulative layer coupled to a lead frame; and
   at least one ground stud physically coupled to the lead frame and to the die, the at least one ground stud extending from the second side of the electrically insulative layer into the electrically insulative layer from the lead frame;
   wherein the die is wire bonded to the lead frame.

2. The package of claim 1, further comprising an electrically conductive layer coupled between the electrically insulative layer and the die.

3. The package of claim 1, wherein the at least one ground stud comprises two ground studs physically coupled to the lead frame and the die.

4. The package of claim 1, wherein the at least one ground stud extends completely through the electrically insulative layer.

5. The package of claim 1, wherein the lead frame comprises a die flag coupled to the second side of the electrically insulative layer.

6. The package of claim 5, wherein the at least one ground stud physically contacts the die flag and is physically coupled to the die.

7. The package of claim 1, wherein the semiconductor package is a chip on lead package.

8. A semiconductor package comprising:
   a first side of a die directly coupled to a first side of an electrically conductive layer;
   a first side of an electrically non-conductive layer directly coupled to a second side of the electrically conductive layer opposing the first side of the electrically conductive layer;
   a lead frame directly coupled to a second side of the electrically non-conductive layer opposing a first side of the electrically non-conductive layer; and
   at least one ground stud coupled to the lead frame, wherein the ground stud extends through the electrically non-conductive layer and into the electrically conductive layer physically coupling the lead frame and the second side of the electrically conductive layer together;
   wherein a second side of the die is wire bonded to the lead frame.

9. The package of claim 8, wherein the at least one ground stud comprises two ground studs physically coupled to the lead frame and the die.

10. The package of claim 8, wherein the electrically conductive layer is a first wafer backside coating.

11. The package of claim 8, wherein the electrically non-conductive layer is a second wafer backside coating.

12. The package of claim 8, wherein the at least one ground stud is 35-40 micrometers thick.

13. The package of claim 8, wherein the lead frame comprises a die flag coupled to the second side of the electrically non-conductive layer.

14. The package of claim 13, wherein the at least one ground stud physically contacts the die flag and is physically coupled to the die.

15. A method of forming a semiconductor package comprising:
   coating a wafer with a first wafer backside coating (WBC);
   forming a second WBC over the first WBC;
   singulating the wafer into a plurality of die;
   forming at least one ground stud on a lead frame;
   pressing the at least one ground stud through a material of the second WBC to contact the at least one ground stud with the first WBC; and
   wirebonding the die to the lead frame.

16. The method of claim 15, wherein the first WBC is electrically conductive.

17. The method of claim 15, wherein the second WBC is electrically non-conductive.

18. The method of claim 15, wherein the at least one ground stud comprises two ground studs physically coupled to the lead frame and the die.

19. The method of claim 15, wherein the at least one ground stud is gold.

20. The method of claim 15, wherein the at least one ground stud is copper.

* * * * *